(12) United States Patent
Wan et al.

(10) Patent No.: US 12,028,124 B2
(45) Date of Patent: *Jul. 2, 2024

(54) SIGNAL STRENGTH PREDICTION BASED ON LINE OF SIGHT ANALYSIS

(71) Applicants: AT&T Intellectual Property I, L.P., Atlanta, GA (US); AT&T Mobility II LLC, Atlanta, GA (US)

(72) Inventors: Zhen Wan, Plano, TX (US); Xiaoyu Wang, Watchung, NJ (US); Ravi Raina, Skillman, NJ (US); Eric Antonio Alino, Culver City, CA (US); Zhefeng Li, Jersey City, NJ (US)

(73) Assignees: AT&T Intellectual Property I, L.P., Atlanta, GA (US); AT&T Mobility II LLC, Atlanta, GA (US)

(*) Notice: Subject to any disclaimer, the term of this patent is extended or adjusted under 35 U.S.C. 154(b) by 150 days.

This patent is subject to a terminal disclaimer.

(21) Appl. No.: 17/549,003

(22) Filed: Dec. 13, 2021

(65) Prior Publication Data
US 2022/0103271 A1 Mar. 31, 2022

Related U.S. Application Data

(63) Continuation of application No. 16/216,539, filed on Dec. 11, 2018, now Pat. No. 11,233,593.

(51) Int. Cl.
*H04B 17/318* (2015.01)
*H04B 7/022* (2017.01)
(Continued)

(52) U.S. Cl.
CPC .......... *H04B 17/373* (2015.01); *H04B 7/022* (2013.01); *H04B 7/082* (2013.01); *H04B 17/318* (2015.01);
(Continued)

(58) Field of Classification Search
CPC . H03J 1/0066; H04B 17/3912; H04B 17/318; H04B 1/1027; H04B 10/697; H04B 17/346; H04B 17/336; H04B 10/112
See application file for complete search history.

(56) References Cited

U.S. PATENT DOCUMENTS 6,256,506 B1   7/2001  Alexander, Jr. et al.
7,468,696 B2  12/2008  Bornholdt
(Continued)

OTHER PUBLICATIONS

Xiaoyong Chen, Hualing Wu, and Tran Minh Tri, "Field strength prediction of mobile communication network based on GIS", Sep. 3, 2012, Geo-spatial Information Science, pp. 199-206 (Year : 2012).*

(Continued)

*Primary Examiner* — Salvador E Rivas
(74) *Attorney, Agent, or Firm* — Guntin & Gust, PLC; Miyoung Shin

(57) ABSTRACT

Architectures and techniques are presented that can provide point-to-point analysis to generate an improved signal strength prediction (SSP) based on, e.g., earth surface image data processing and analysis to draw conclusions of line of sight (LOS) along the propagation path between a BTS or another AP transmitter and CPE receiver. For example, USGS image data and/or elevation data of locations are identified to correspond to signal propagation between the transmitter and receiver can be analyzed for LOS signal quality at a fixed location, in addition to the statistical model prediction of the RF signal quality. As a result, foliage or terrain that obstructs the LOS can be identified and utilized to improve SSP by eliminating the additional pathloss due to LOS obstructions. Such can provide a significant improvement to SSP results that are conventionally predicted by statistical models rather than a point-to-point analysis.

20 Claims, 11 Drawing Sheets

(51) Int. Cl.
  *H04B 7/08*      (2006.01)
  *H04B 17/309*    (2015.01)
  *H04B 17/336*    (2015.01)
  *H04B 17/373*    (2015.01)
  *H04B 17/391*    (2015.01)
  *H04W 16/20*     (2009.01)
  *H03J 1/00*      (2006.01)
  *H04B 1/10*      (2006.01)
  *H04B 10/112*    (2013.01)
  *H04J 11/00*     (2006.01)

(52) U.S. Cl.
  CPC ......... *H04B 17/336* (2015.01); *H04B 17/346* (2023.05); *H04B 17/3913* (2015.01); *H04W 16/20* (2013.01); *H03J 1/0066* (2013.01); *H04B 1/1009* (2013.01); *H04B 10/112* (2013.01); *H04J 11/0053* (2013.01)

(56) References Cited

U.S. PATENT DOCUMENTS

| | | | |
|---|---|---|---|
| 8,442,552 B2 | 5/2013 | Gallegos | |
| 8,542,109 B2 | 9/2013 | Butler et al. | |
| 8,649,418 B1 | 2/2014 | Negus et al. | |
| 9,252,857 B2 | 2/2016 | Negus et al. | |
| 9,338,604 B2 | 5/2016 | Stanforth et al. | |
| 9,363,645 B2 | 6/2016 | Lavery | |
| 9,629,055 B2 | 4/2017 | Hussain et al. | |
| 9,655,035 B2 | 5/2017 | Beattie et al. | |
| 9,848,337 B2 | 12/2017 | Puthenpura et al. | |
| 9,872,277 B2 | 1/2018 | Park et al. | |
| 10,405,196 B1* | 9/2019 | Chadaga | H04B 17/27 |
| 11,233,593 B2* | 1/2022 | Wan | H04W 16/22 |
| 2008/0143603 A1* | 6/2008 | Bornholdt | G01S 5/14 |
| | | | 342/464 |
| 2008/0259834 A1 | 10/2008 | Joung et al. | |
| 2014/0141788 A1 | 5/2014 | Puthenpura et al. | |
| 2014/0376455 A1* | 12/2014 | Autti | H04B 7/061 |
| | | | 370/329 |
| 2016/0323750 A1 | 11/2016 | Mchenry et al. | |
| 2019/0150006 A1* | 5/2019 | Yang | G06N 3/08 |
| | | | 455/422.1 |
| 2019/0285754 A1 | 9/2019 | Van diggelen | |
| 2021/0306809 A1* | 9/2021 | Perdew | H04W 4/027 |

OTHER PUBLICATIONS

Non-Final Office Action received for U.S. Appl. No. 16/216,539 dated May 27, 2020, 48 pages.

Chen et al., "Field strength prediction of mobile communication network based on GIS", Geo-spatial Information Science, Sep. 3, 2012, pp. 199-206.

Final Office Action received for U.S. Appl. No. 16/216,539 dated Nov. 18, 2020, 30 pages.

Non-Final Office Action received for U.S. Appl. No. 16/216,539 dated May 24, 2021, 38 pages.

\* cited by examiner

SIGNAL STRENGTH PREDICTION BASED ON LINE OF SIGHT ANALYSIS

RELATED APPLICATION

The subject patent application is a continuation of, and claims priority to, U.S. patent application Ser. No. 16/216,539, filed Dec. 11, 2018, and entitled "SIGNAL STRENGTH PREDICTION BASED ON LINE OF SIGHT ANALYSIS," the entirety of which application is hereby incorporated by reference herein.

TECHNICAL FIELD

The present application relates generally to employing line of sight according to a point-to-point analysis to determine a signal strength metric prediction at a defined location.

BACKGROUND

Wireless service providers rely on signal strength predictions to identify whether a given service can be provided to a customer at a fixed location, such as a customer premises. Today, such signal strength predictions are determined by comprehensive statistical models that analyze large geographical areas. For example, each pixel of a map can be assigned a signal strength prediction based on numerous factors such as distance from an access point device (e.g., a base transceiver station or BTS), local terrain and morphology type, and so forth. Depending on scale, a given pixel might represent, e.g., a 100-meter×100-meter area. Thus, a determination of whether a customer property or premises located in that 100-meter×100-meter area is suitable for customer premises equipment (CPE) installation can be based on the statistically generated signal strength prediction provided by the model.

BRIEF DESCRIPTION OF THE DRAWINGS

Numerous aspects, embodiments, objects and advantages of the present application will be apparent upon consideration of the following detailed description, taken in conjunction with the accompanying drawings, in which like reference characters refer to like parts throughout, and in which.

DETAILED DESCRIPTION

Overview

Figure 1A:
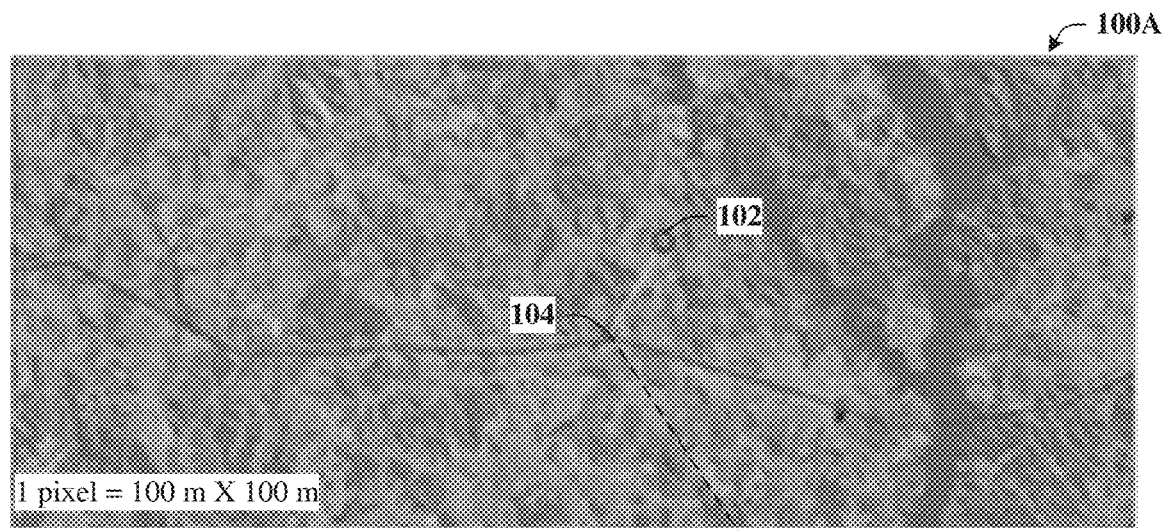
FIG. 1A illustrates a graphical depiction that presents an orthogonal view of a geographical region to demonstrate operation of conventional statistical models that predict signal strength.

The disclosed subject matter is now described with reference to the drawings, wherein like reference numerals are used to refer to like elements throughout. In the following description, for purposes of explanation, numerous specific details are set forth in order to provide a thorough understanding of the disclosed subject matter. It may be evident, however, that the disclosed subject matter may be practiced without these specific details. In other instances, well-known structures and devices are shown in block diagram form in order to facilitate describing the disclosed subject matter.

Some wireless services, such as fixed wireless, are tied to a signal quality obtained at a specified location, such as at a customer premises or other known location. Although not strictly necessary for all embodiments of the disclosed subject matter, many such wireless services rely on or require equipment that remains at a fixed location and is installed at the customer premises. While other examples can exist, a non-limiting, representative example of such used for the remainder of this disclosure is a fixed wireless broadband service, where broadband service can be provided to the customer at a fixed location via wireless communication rather than hardwired lines such as digital subscriber line (DSL) or cable. Fixed wireless broadband service can be highly desired for certain customers, such as customers who live in rural areas where broadband solutions are limited, or for customers who otherwise cannot, or prefer not to, obtain DSL, cable or other broadband alternatives.

Hence, to provide wireless broadband service (or another suitable type of service) it is customary to install a fixed antenna or other receiving device as well as other equipment at the customer premises. Such equipment is referred to herein as customer premises equipment (CPE). It is advantageous for providers and customers to know in advance what type (e.g., QoS or throughput tier or the like) of service that can be provided at the customer site or whether any service can be provided at all.

Generally, both the provider and the customer benefit when practical realities closely match expectations or estimates. For example, it can be expensive for a provider, and frustrating to the customer, to learn that service (or a level of service) cannot be provided only after installation personnel arrive at the customer premises to perform signal strength measurements. Thus, accurate signal strength predictions are highly desired in advance of a sales agreement, or service personnel arriving at the customer site where actual signal strength measures can be obtained. As used herein, reference signal received quality (RSRP) is used as a representative example of the signal strength prediction, but it is understood that any suitable signal strength metric can be used.

As noted in the background section, providers typically rely on sophisticated statistical models to provide this signal strength prediction. With reference now to FIG. 1A, graphical depiction 100A presents an orthogonal view of a geographical region to demonstrate operation of conventional statistical models that predict signal strength. Typically, the geographic region is organized as a grid of some granularity, for example, each section of the grid can represent a 100-meter by 100-meter area. For each grid area, statistical models provide a prediction for signal strength, typically based on pathloss and clutter losses of a dominant path radio frequency (RF) signal. As illustrated, each pixel of graphical depiction 100A represents a different 100-meter by 100-meter grid area and can be assigned a unique signal strength prediction value that is essentially used to qualify any point within that grid area.

Fixed wireless (and other) services generally require pre-sales qualification, which is conventionally provided by the statistical models introduced above. Based on the address of the potential customer's premises, the corresponding grid area can be identified, and the signal strength prediction accessed to determine whether qualifications can be met. For example, location 104, that is some distance away from access point (AP) device 102 (e.g., a BTS) can be examined for signal strength qualification. Assuming qualifications are met, if the signal strength prediction is reasonably accurate, such is likely to lead to an installation success.

Otherwise, if the signal strength prediction is inaccurate, then an installation failure is more likely to occur. As used herein, an installation failure refers to a situation in which the signal strength prediction is sufficient to pass a pre-sales qualification, and/or a sale was made, but on-site installation personnel were not able to measure, either before or after installation, a sufficient signal strength to support the ordered service. As noted, installation failures are costly to the provider both economically and in terms of market goodwill.

Thus, increasing the accuracy of signal strength predictions can be beneficial, e.g., by reducing the potential for installation failures. Presently, statistical models available in the industry have an error margin of about 6-8 decibels (dB) relative to actual measurements. The error margin can depend on a variety of factors such as modeling, clutter, morphology, terrain databases, geo-addressing, and so forth. In some instances, due in part to a high variance in one or more of the factors noted above, signal strength prediction can have an error margin of 20-30 dB. As a result, about 50% of all installation failures happen in grid areas that are at or near a cell edge, where signal strength is low to begin with.

Errors in signal strength prediction accuracy tend to arise because signal strength metrics, particularly at a cell edge, heavily depend on a line of sight (LOS) between a transmitter (e.g., AP device 102) and the receiver (e.g., CPE at location 104). Because statistical models are not precise enough to reflect actual LOS or non-LOS (NLOS) conditions, a potential will always exist for statistical model predictions to vary from actual measurements that can be a function of LOS. Such is especially true in cases where the statistical model database and prediction grid granularity is low, an example of which is illustrated at FIG. 1B.

Figure 1B:
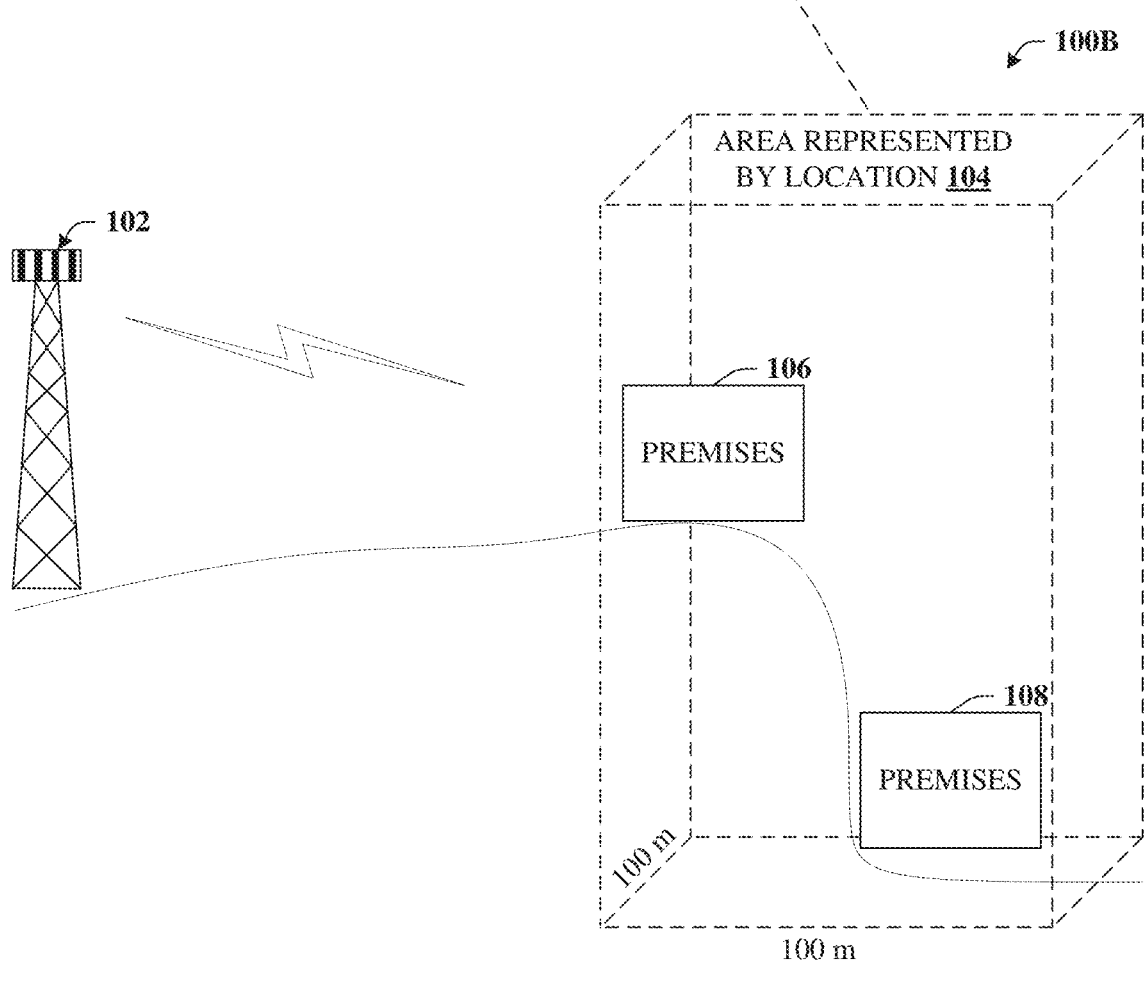
FIG. 1B depicts a diagram of an example side view of some portions of the geographic region.

FIG. 1B illustrates diagram 100B. Diagram 100B is an example side view of some portions of the geographic region. It is understood diagram 100B is not drawn to scale. In this example, AP device 102 is about 4.2 miles away from location 104, which might be at or near a cell edge of AP device 102. As noted, location 104 can be a 100-meter by 100-meter grid, which could be the site for multiple premises and might contain one or more structure, landscape, or terrain feature that can significantly impact signal strength in some parts of location 104 but not in others. In those cases, the statistical model may not have sufficient granularity to accurately determine local (e.g., intra-location 104) conditions.

For example, as illustrated, premises 106 is at the top of an incline with a clear propagation path from AP device 102. In contrast, premises 108 is at a lower elevation due to a terrain feature and, more significantly, does not have a clear propagation path to AP device 102. In other words, premises 108 has NLOS conditions. While a signal strength prediction by a statistical model may reasonably reflect many areas within the location 104 grid, the model does not have the granularity to distinguish between the starkly different local conditions between premises 106 and premises 108. For instance, a signal strength prediction by a statistical model is likely to indicate that both premises 106 and premises 108 pass qualification or that both fail qualification. However, actual field measurements would likely reveal that premises 106 passes qualification, whereas premises 108 fails.

The disclosed subject matter can be employed to provide a qualification enhancement tool (QET) or otherwise provide improved accuracy over a signal strength prediction generated by a statistical model. Distinct from statistical models, the disclosed subject matter can perform point-to-point analysis, e.g., by performing LOS analysis between AP device 102 and CPE (e.g., a transceiver) at a customer premises. Thus, local conditions such as the various local conditions that differentiate premises 106 from premises 108 can be accounted for, resulting in a potentially more accurate signal strength prediction and fewer failed installations.

Example Systems

Figure 2:
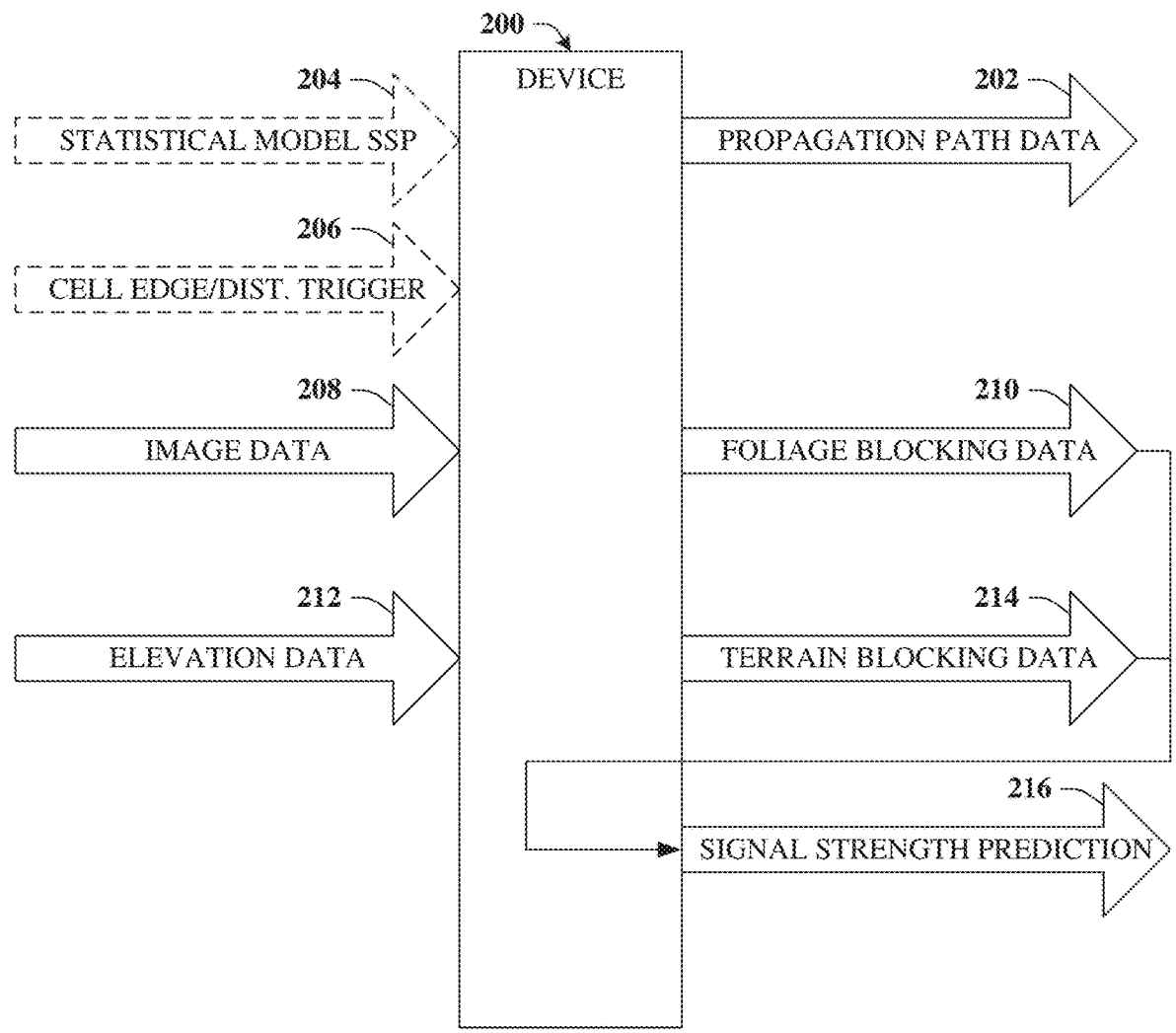
FIG. 2 is a block diagram illustrating an example device that can provide point-to-point analysis to generate an improved signal strength prediction (SSP) based on propagation path data in accordance with certain embodiments of this disclosure.

Turning now to FIG. 2, device 200 is depicted. Device 200 can provide point-to-point analysis to generate an improved signal strength prediction (SSP) based on propagation path data in accordance with certain embodiments of this disclosure. For example, point-to-point analysis can leverage an examination of an actual LOS between two transceivers and potentially more accurately account for NLOS conditions. Generally, device 200 can comprise a processor and a memory that stores executable instructions that, when executed by the processor, facilitate performance of operations. Examples of the memory and processor can be found with reference to FIG. 11. It is to be appreciated that the computer 1102 can represent a server device of a communications network or a user equipment device and can be used in connection with implementing one or more of the systems, devices, or components shown and described in connection with FIG. 2 and other figures disclosed herein.

Device 200 can be configured to determine propagation path data 202. Propagation path data 202 can be representative of signal propagation in a line of sight between an access point device (e.g., access point device 102) and a target premises. For example, the AP device can be a BTS or other suitable device or system and the target premises can be one that is identified as a potential CPE location and/or a location where a fixed wireless antenna/transceiver can be installed.

As was noted previously, the claimed subject matter can provide improved accuracy over an SSP generated by an existing statistical model. Thus, in some embodiments, statistical model SSP 204 and other data employed by or accessible to a statistical model can represent optional input to device 200. That is, some embodiments may leverage such input from a statistical model, while other embodiments might not. Furthermore, because statistical models do provide reasonably reliable results in many cases but are observed to have greater error margins when the target premises is at or near a cell edge, in some embodiments, a cell edge or distance trigger 206 can be optionally employed. For instance, if the target premises is determined to be more than a defined distance from a serving AP device and/or is otherwise (e.g., due to morphology, AP power settings, etc.) at a cell edge, such can trigger the determination of propagation path data 202 as well as other functionality or techniques detailed herein.

Device 200 can further receive image data 208. Image data 208 can be representative of locations determined (e.g., by device 200) to be along the propagation path, which can be identified based on propagation path data 202. In other words, image data 208 can be actual images of geographic locations that coincide with the line of sight. As one example, image data 208 can be received or obtained from a government entity such as the United States Geological Survey (USGS) or from a different entity. Regardless, in response to examining image data 208, device 200 can determine foliage blocking data 210. Foliage blocking data 210 can represent an object situated in the line of sight. In other words, an object that obstructs the LOS and causes a NLOS condition. The object will typically be trees or other foliage, but it is understood that buildings and other structures can be identified as well Device 200 can also receive elevation data 212 that can be representative of a ground elevation at the locations determined to be along the line of sight. In some embodiments, the elevation at the locations along the line of sight can be determined based on image data 208 but might also be determined from topographic map data or the like, which can be obtained from USGS or other suitable sources. In response to examining elevation data 212, device 200 can determine terrain blocking data 214. Terrain blocking data 214 can be representative of terrain situated in the line of sight. In other words, terrain or land formations that are determined to obstruct the propagation path. Premises 108 of FIG. 1 illustrates an example of terrain obstructing a propagation path between AP device 102.

Based on foliage blocking data 210 and terrain blocking data 214, device 200 can determine a signal strength prediction 216 for the target premises. In cases where an obstruction (e.g., foliage or another above-ground structure or the ground itself) exists in the propagation path, device 200 can implement NLOS calculations that can more accurately reflect the local conditions of the target premises. In cases where no obstructions exist, that confirmation as well can be employed to improve over the statistical model SSP, which may reflect some statistical probability that the signal is blocked, whereas the point-to-point model can verify a clear propagation path.

Significantly, foliage blocking data 210 and terrain blocking data 214 can be determined by examining image data 208 and elevation data 210 that are determined to be along a line of sight rather than merely examining similar data in connection with surrounding areas without taking into account one or more specific antenna/receiver positions and corresponding lines of sight or propagation paths. Such can result in significantly limiting the amount of data to be examined and has the additional benefit of providing a more accurate SSP 216 that is specifically tailored to the target location to a much finer degree.

Figure 3:
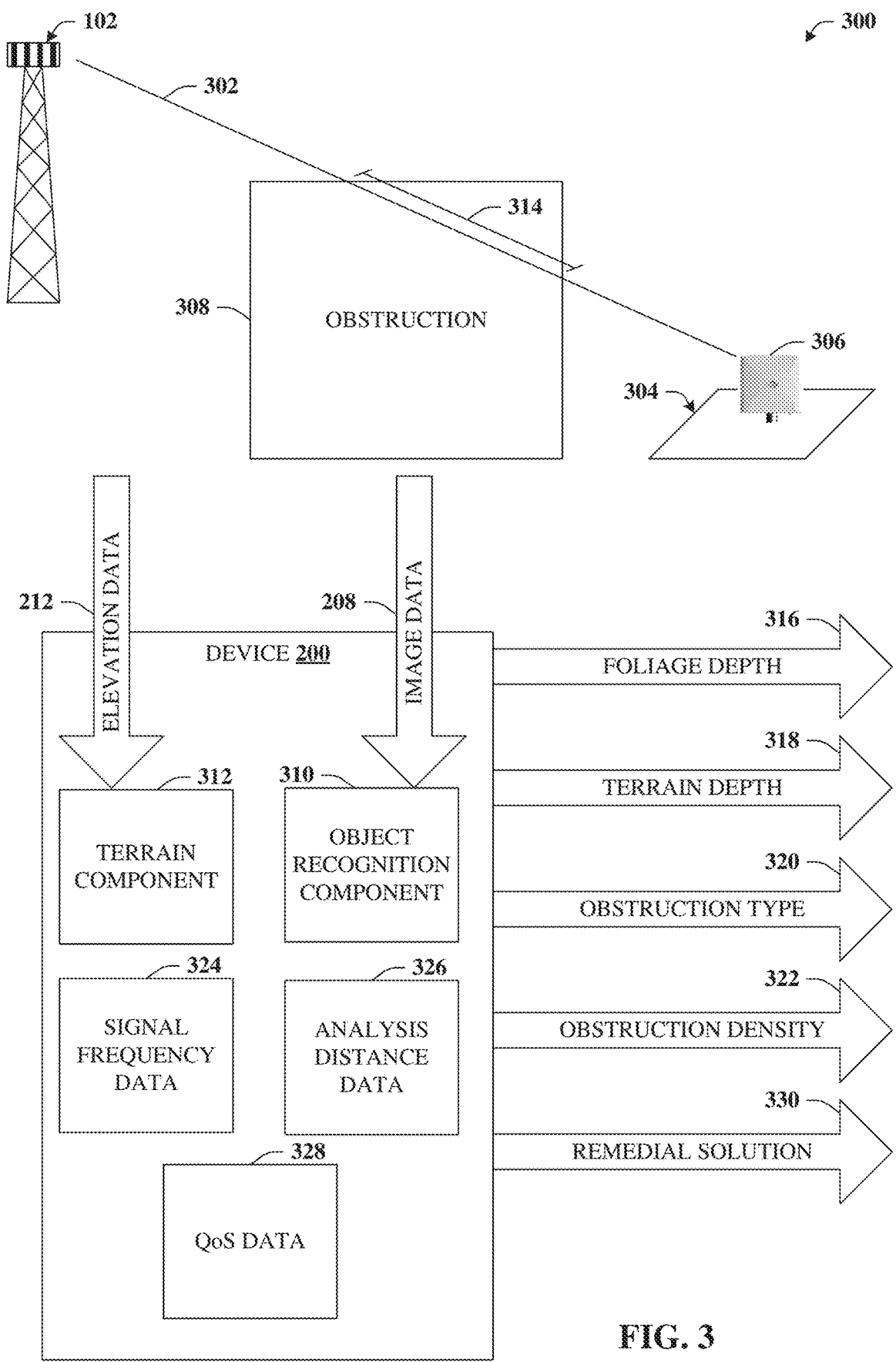
FIG. 3 depicts a diagram that can provide for additional aspects or elements in connection with point-to-point analysis to generate an improved signal SSP in accordance with certain embodiments of this disclosure.

With reference now to FIG. 3, diagram 300 is depicted. Diagram 300 can provide for additional aspects or elements in connection with point-to-point analysis to generate an improved signal strength prediction (SSP) in accordance with certain embodiments of this disclosure. For example, diagram 300 depicts a propagation path 302 between AP device 102 and target premises 304, and more specifically, to a proposed site of an antenna 306 (e.g., CPE) situated at target premises 304. As illustrated propagation path 302 is obstructed by obstruction 308, creating a NLOS condition. It is understood that propagation path 302 can be an example of a line that is described by propagation path data 202.

In this example, image data 208 is processed by object recognition component 310 to identify one or both that obstruction 308 exists in propagation path 302 and/or characteristics of obstruction 308. Additionally, or alternatively, elevation data can be received by terrain component 312, which can identify that the ground or terrain obstructs propagation path 302. Regardless of the type of nature of obstruction 308, device 200 can, in some embodiments, determine a blocking depth parameter representative of a length 314 of the propagation path 302 that is obstructed by obstruction 308. It is understood that multiple obstructions 308 might exist, but for the sake of clarity, this example illustrates a single obstruction.

As a representative example, foliage blocking data 210 (e.g., determined by device 200) can comprise foliage depth parameter 316 that can be representative of length 314 (e.g., a length of propagation path 302 that is obstructed). For cases where obstruction 308 is the ground itself, terrain blocking data 214 can comprise terrain depth parameter 318 that can be representative of length 314. Foliage depth parameter 316 and/or terrain depth parameter 318 can be employed to determine NLOS effects on signal strength.

In some embodiments, foliage blocking data 210 that is determined by device 200 can comprise obstruction type data 320 that can be representative of a type of obstructions 308. Obstruction type data 320 can relate to classification information such as identifying whether obstruction 308 is indicative of trees, buildings, ground or the like, which can be identified, e.g., by object recognition component 310. Additionally, or alternatively, obstruction type data 320 can relate to particular characteristic of obstruction 308 such as a material composition or an obstruction density data 322. For instance, foliage obstructing propagation path 302 can be identified as sparse (e.g., less than about 20% tree growth density), light (e.g., between about 20% to 40% tree density), medium (e.g., between about 40% and 60% tree density), heavy (e.g., between about 60% to 80% tree density), extra heavy (e.g., above about 80% tree density), or some other relevant classification. It is understood that based on the obstruction type data 320, obstruction density data 322, or other characteristics of obstruction 308, NLOS calculations or adjustments can be more accurately estimated by device 200.

In addition to obstruction density, type, or composition, signal frequency can also be a relevant consideration, as the effects of obstruction 308 on a received signal strength can vary according to the frequency of the signal. Thus, in some embodiments, device 200 can determine SSP 216 based on obstruction type data 320 (which can include obstruction density data 322 or other characteristics) and a frequency of signals to be used to communicate with CPE at target premises 304. The frequency of signals can be determined based on signal frequency data 324 that can be stored in a local or remote data store. Since fixed wireless services are used herein as a representative example, the frequency of signals to be used to communicate with CPE at target premises 304 can be determined to be in a wireless communications service (WCS) spectrum. WCS spectrum is generally characterized as a 2.3 gigahertz (GHz) band. It is understood that other frequencies are considered depending on the application, as it is readily observed that the disclosed techniques can be employed in connection with any suitable fixed wireless application or service. It is further observed that many of the techniques detailed herein can even be applicable to certain mobile services, provided the mobile service can benefit from line of sight analysis between an AP device and a specific location.

Furthermore, it can be observed that an antenna or transceiver of AP device 102 is both relatively high off the ground and a location for the AP device 102 can be selected by the provider to have advantageous characteristics such as little or no potential obstructions in the surrounding areas. In contrast, target premises 304 is not likely to share these characteristics so that CPE will typically be much closer to ground level and will be much more likely to be surrounded by potential obstructions. As one result, analysis performed by device 200 on locations along propagation path 302 can be much more relevant at or near target premises 304 than at or near AP device 102. Hence, in some embodiments, the locations determined to be along the line of site (for which image data 208 and elevation data 212 are examined) can be limited to locations within a defined distance from target premises 304, since those are the more likely locations of obstruction 308. The defined distance can be determined from analysis distance data 326, which can represent a suggested distance from the target where analysis is most relevant. In other words, supposing the distance between AP device 102 and target premises 304 is about four miles, device 200 might limit analysis of image data 208 or elevation data 212 to only those locations that are both along propagation path 302 and within one mile (or some other defined distance) of target premises 304.

In some embodiments, the defined distance can be a configurable parameter that can be manually input, obtained from a table lookup based on geographic or technical constraints or any other suitable factor, or determined based on machine learning techniques. In some embodiments, the defined distance can be individually configurable for the determining the foliage blocking data 210 and the determining the terrain blocking data 214. For example, consider an area that largely has flat terrain but also has several old growth forests that can reach extreme heights. In that case, a first defined distance of two miles might be selected in connection with determining foliage blocking data 210 since high trees can conceivably obstruct propagation path 302 at much greater distances from target premises 304. However, a second defined distance of half a mile might be selected in connection with determining terrain blocking data 214 since the terrain is relatively flat and not likely to obstruct propagation path 302 at an appreciable distance from target premises 304.

Apart from examining SSP 216 to determine the value is above some minimum threshold (e.g., a RSRP above about −117 dB) to provide service, device 200 can, in some embodiments, determine whether an installation of CPE at target premises 302 is likely to provide a defined quality of service (QoS). Such might be employed to indicate whether a QoS or throughput tier can be reliably provided at target premises 304. Any such determinations can be made based on QoS data 328, which might provide benchmarks or target thresholds for minimum service or higher levels of service and so forth.

In some embodiments, device 200 can, e.g., based on SSP 216 and propagation path data 202, determine a remedial solution 330 that can be determined to improve SSP 216 for target premises 304, which is further detailed in connection with FIG. 4A.

Figure 4A:
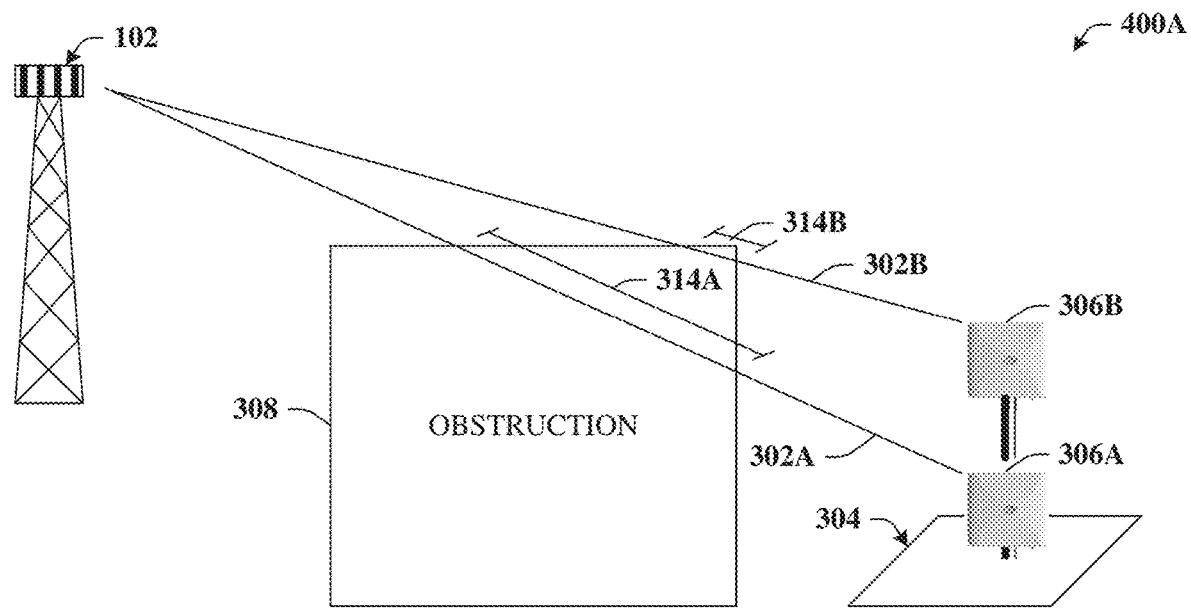
FIG. 4A depicts a diagram illustrating an example remedial solution that is determined to provide an improved SSP in accordance with certain embodiments of this disclosure.

FIG. 4A depicts a diagram 400A illustrating an example remedial solution that is determined to provide an improved SSP 216 in accordance with certain embodiments of this disclosure. Consider the case where a potential customer calls a provider to request fixed wireless service. In conventional systems, a statistical model is employed and suppose the statistical model indicates a signal strength estimate that meets a minimum service threshold despite the presence of obstruction 308, which the statistical model might only consider, if at all, in a probabilistic sense rather than based on specific point-to-point LOS model detailed herein. Further suppose that based on the output of the statistical model, a sales representative of the provider informs the customer that service can be provided at his or her location and quotes the standard terms such as installation fee, service pricing, etc.

However, when installation personnel arrive at target premises 304, actual measurements reveal that signal strength is too low to provide service due to the presence of obstruction 308. In this example, antenna 306A represents a standard or default installation (e.g., front of the house or mounted on a six-foot pole). As can be seen, a corresponding propagation path 302A has a large obstruction length 314A, resulting in a signal that is more attenuated than expected. Such might result in an installation failure, which is undesirable.

Alternatively, suppose the service personnel are sufficiently thorough and discover that while a standard installation is not suitable, a non-standard installation will provide a signal strength sufficient to meet the expectations of the customer. For example, a fifteen-foot pole-mounted antenna 306B can provide propagation path 302B with no or a much smaller obstruction length 314B. Further suppose this non-standard installation increases the installation cost beyond the customer's expectations. Such can lead to customer dissatisfaction or refusal, which are also undesirable.

In contrast to the above scenarios, consider a case in which the disclosed subject matter is used. For example, device 200 can determine propagation path data 202 for both propagation paths 302A and 302B. The sales representative can then leverage this information to give the customer more accurate information. For example, the customer can be informed up front that a standard installation will not provide the required signal strength due to the presence of obstruction 308. However, a fifteen-foot pole-mounted antenna can largely clear obstruction 308 and provide the requested service. Even if such amounts to increased installation expense, the customer is better able to make an informed decision pre-sale instead of post-sale, which can result in a much better customer experience.

Figure 4B:
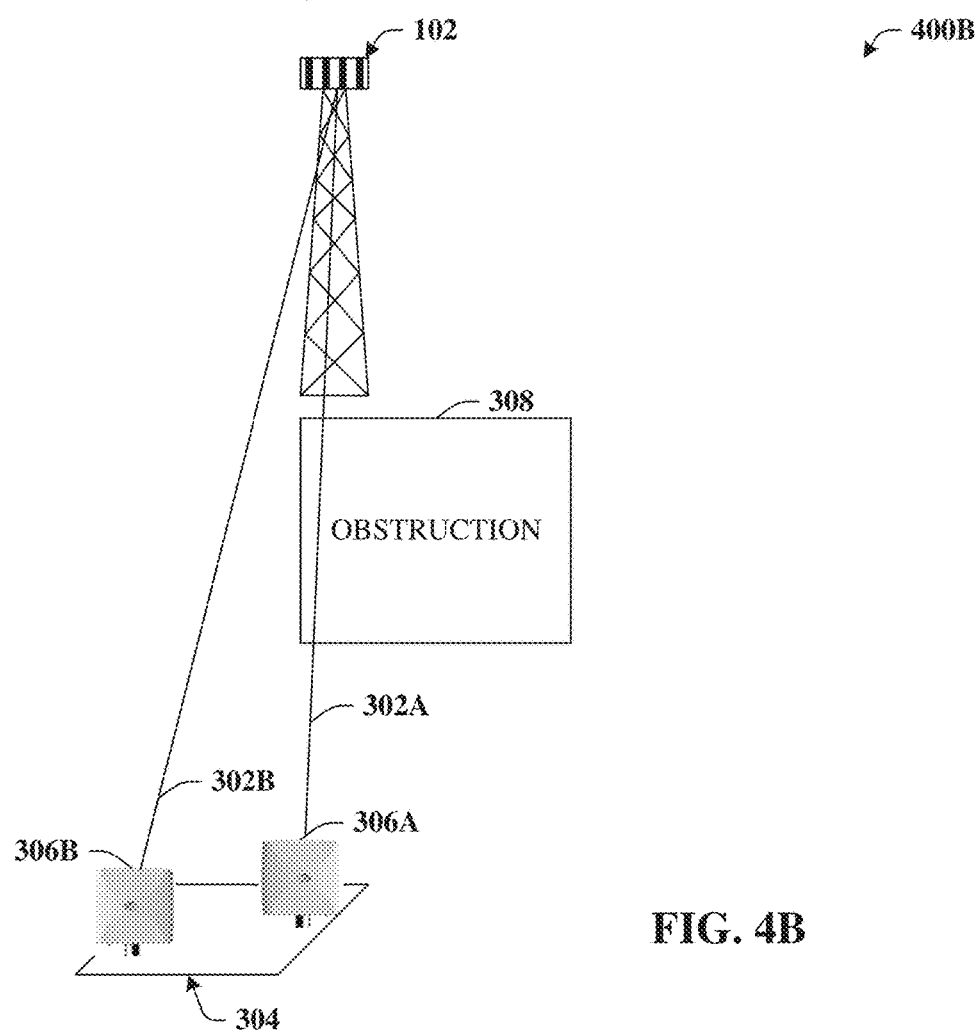
FIG. 4B depicts a diagram illustrating a location-selection example that is determined to provide an improved SSP in accordance with certain embodiments of this disclosure.

FIG. 4B depicts a diagram 400B illustrating a location-selection example that is determined to provide an improved SSP 216 in accordance with certain embodiments of this disclosure. Similar to the above case, diagram 400B illustrates two different propagation paths. Propagation path 302A, corresponding to a standard installation of CPE 306A (e.g., front of the house) is obstructed. In contrast, propagation path 302B, corresponding to the opposite side of target premises 304, is not obstructed. Such information can be provided to installation personnel to reduce potential pitfalls or confusion as well as to improve installation time.

Figure 5:
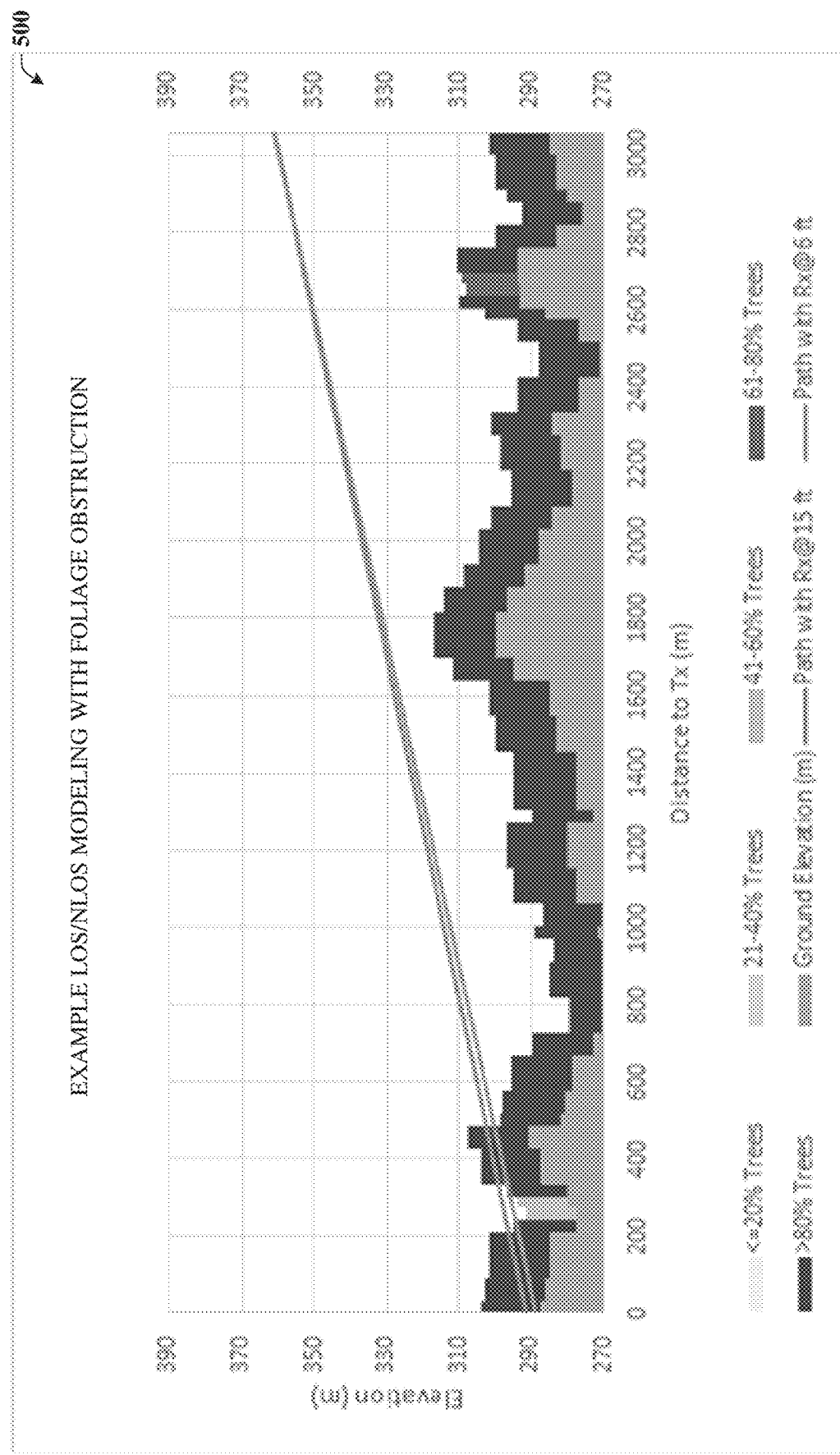
FIG. 5 depicts a graph that illustrates an example representation of LOS/NLOS modeling in connection with foliage obstruction in accordance with certain embodiments of this disclosure.

Turning now to FIG. 5, a graph 500 is illustrated. Graph 500 illustrates an example representation of LOS/NLOS modeling in connection with foliage obstruction in accordance with certain embodiments of this disclosure. The y-axis indicates height/elevation (in meters) and the x-axis represents distance (in meters). Graph 500 is overlaid with a cross-section of the environment in a plane coinciding with the propagation path. Here, both the target premises (left side of the graph) and the AP device (right side of the graph) are situated on land that is about 290 m above sea level about three kilometers apart. The antenna of the AP device is mounted on a tower about 70 m in height and two distinct lines of sight are depicted, one for CPE antenna at six feet off the ground and one for the CPE antenna fifteen feet off the ground.

As depicted, the terrain is illustrated in light gray and foliage in dark gray. There is no terrain obstruction to either propagation path, but medium to heavy foliage obstruction is readily observed at two distinct distances from target premises 304. This information represents a hindsight look at an actual failed installation in which the statistical model indicated that signal strength prediction was acceptable, but installation personnel were subsequently not able to measure enough RSRP to provide service. Techniques provided herein may have prevented this installation failure, e.g., by analyzing the foliage blocking data 210.

Case studies reveal that about 40% of failed installations have foliage blocking or clearance issues although statistical models predicted signal strength qualifications were met. It is not uncommon in many parts of the world to have tree canopies ranging from 70 to 100 feet spread all about the environment. To better understand the difficulties, consider that, on flat terrain, a cell site (e.g., AP device 102) with a 300-foot tower is three miles away from the customer location. In that case, a small forest or copse of trees only 30 feet high and only about one-third of a mile away from the target premises 304 can obstruct the propagation path.

Figure 6:
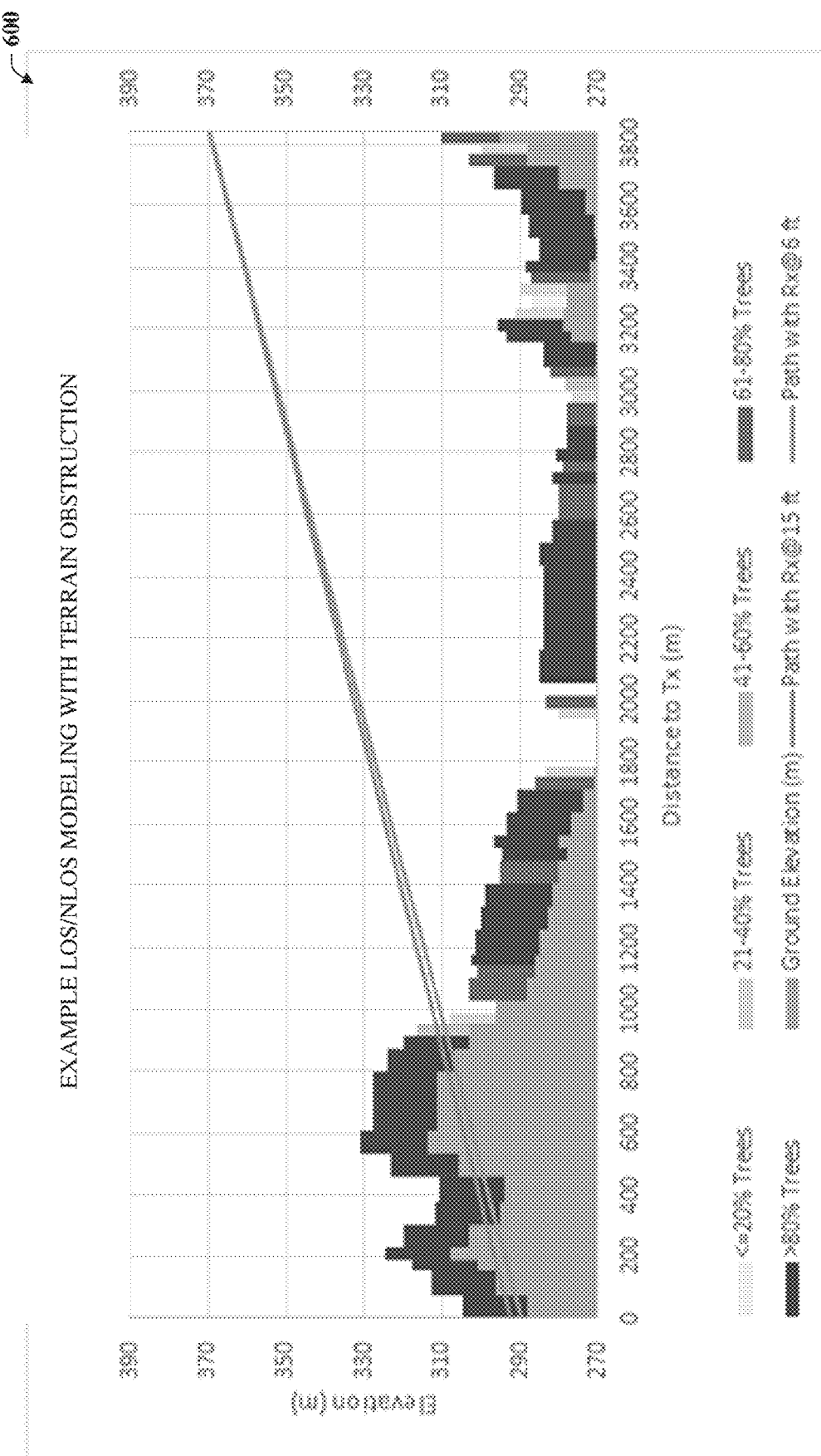
FIG. 6 is an example graph that illustrates an example representation of LOS/NLOS modeling in connection with terrain obstruction in accordance with certain embodiments of this disclosure.

Turning now to FIG. 6, a graph 600 is illustrated. Graph 600 illustrates an example representation of LOS/NLOS modeling in connection with terrain obstruction in accordance with certain embodiments of this disclosure. Very similar to Graph 500, here, the y-axis indicates height/elevation (in meters) and the x-axis represents distance (in meters). Graph 600 is overlaid with a cross-section of the environment in a plane with the propagation paths. Here, both the target premises (left side of the graph) and the AP device (right side of the graph) are situated on land that is about 290 m above sea level just under four kilometers apart. The antenna of the AP device is mounted on a tower about 80 m in height and two distinct propagation paths are depicted, one for CPE antenna at six feet off the ground and one for the CPE antenna fifteen feet off the ground.

In this case, terrain obstruction causes the greater issue. Graph 600 also represents a hindsight look at an actual failed installation in which the statistical model indicated that signal strength prediction was acceptable, but installation personnel were subsequently not able to measure enough RSRP to provide service. Once more, techniques provided herein may have prevented this installation failure, e.g., by analyzing the terrain blocking data 214.

Example Methods

Figure 7:
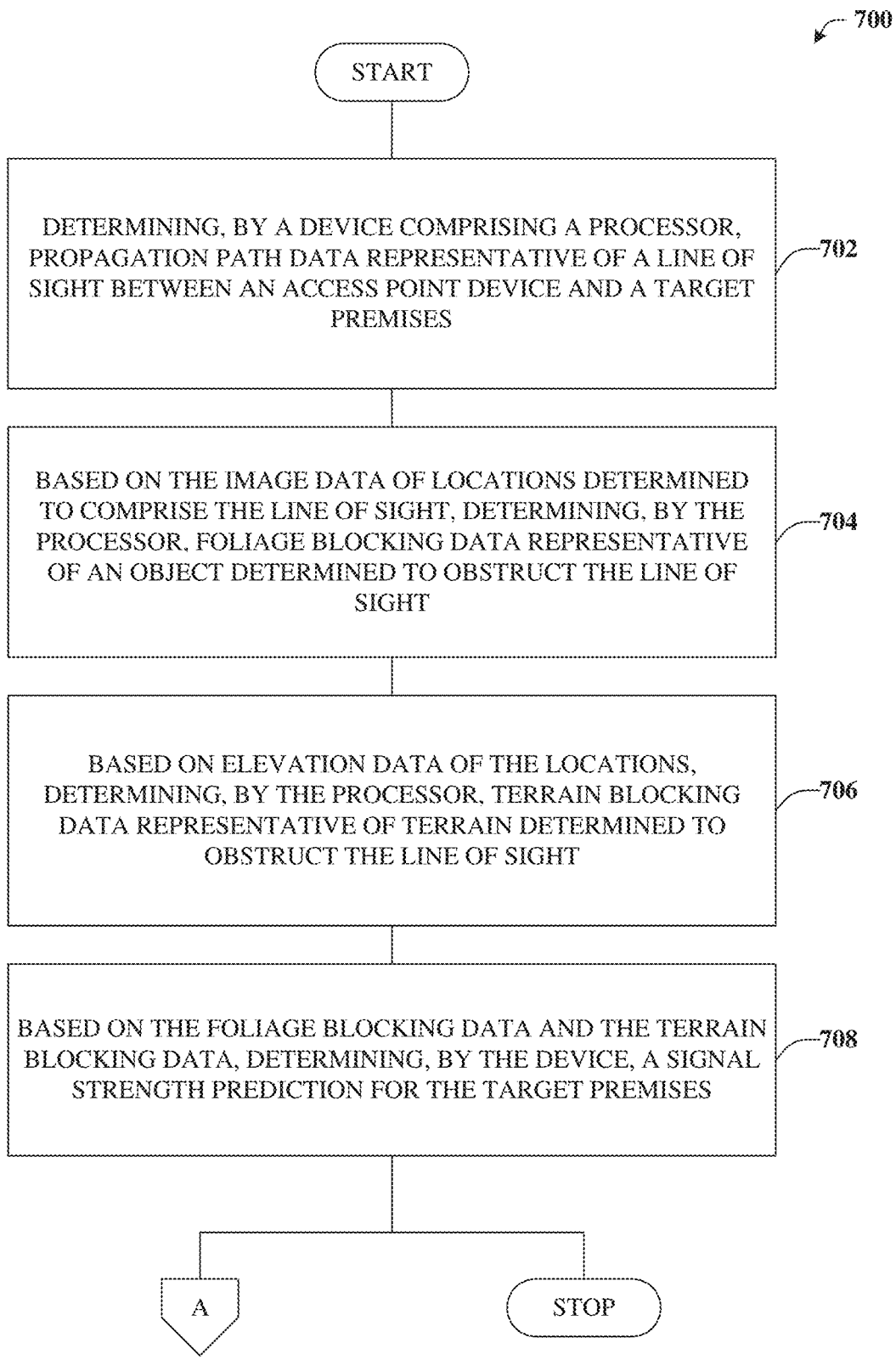
FIG. 7 illustrates an example methodology that can provide point-to-point analysis to generate an improved SSP based on propagation path data in accordance with certain embodiments of this disclosure.
Figure 8:
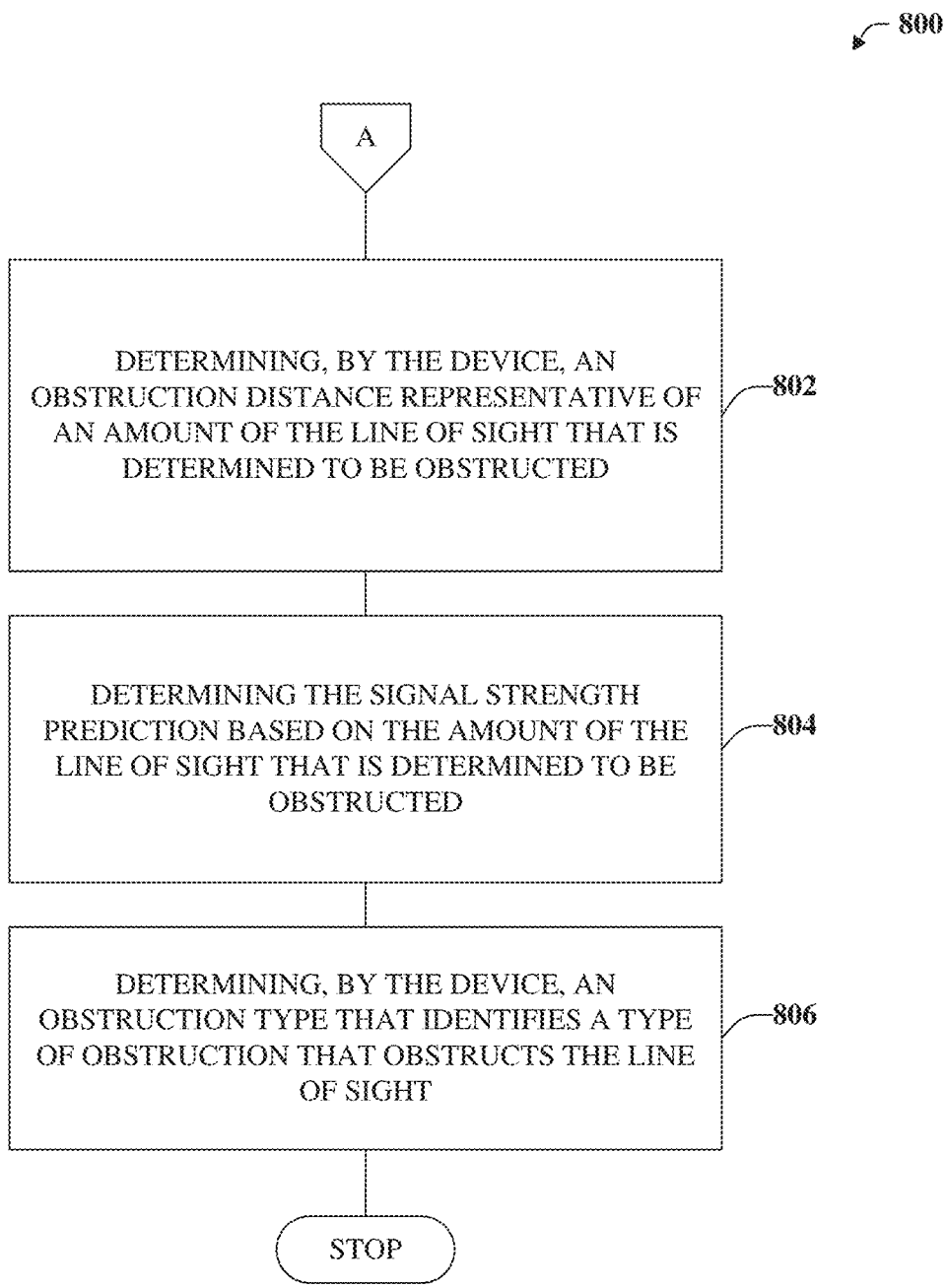
FIG. 8 illustrates an example methodology that can provide for additional elements or aspects in connection with point-to-point analysis to generate an improved SSP based on propagation path data in accordance with certain embodiments of this disclosure.

FIGS. 7 and 8 illustrate various methodologies in accordance with the disclosed subject matter. While, for purposes of simplicity of explanation, the methodologies are shown and described as a series of acts, it is to be understood and appreciated that the disclosed subject matter is not limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the disclosed subject matter. Additionally, it should be further appreciated that the methodologies disclosed hereinafter and throughout this specification are capable of being stored on an article of manufacture to facilitate transporting and transferring such methodologies to computers.

Turning now to FIG. 7, exemplary method 700 is depicted. Method 700 can provide point-to-point analysis to generate an improved SSP based on propagation path data in accordance with certain embodiments of this disclosure. For example, at reference numeral 702, a device comprising a processor can determine propagation path data representative of a line of sight between an access point device and a target premises. The target premises can be one that corresponds to a premises of a potential customer requesting a wireless service, such as a fixed wireless service. It is understood that the device can determine multiple different instances of propagation path data that respectively correspond to multiple positions within or heights above the target premises.

At reference numeral 704, the device can determine foliage blocking data representative of an object determined to obstruct the propagation path. For example, the foliage blocking data can be determined based on image data of specifically selected locations, namely locations that are determined to comprise the line of sight detailed in connection with reference numeral 702.

At reference numeral 706, the device can determine terrain blocking data. For instance, terrain blocking data can be representative of terrain determined to obstruct the propagation path. Once more it is noted that the terrain blocking data can be representative of very specific terrain, not merely based on terrain in 360-degree area around the AP device or the target location, but rather terrain that is specifically determined to obstruct the propagation path. In other words, determining the terrain blocking data can be based on elevation data of the locations that are determined to comprise the line of sight.

At reference numeral 708, the device can determine a signal strength prediction for the target premises. As noted, the signal strength predication can be based on any suitable combination of the foliage blocking data and the terrain blocking data. Method 700 can proceed to insert A, which is further detailed in connection with FIG. 8, or stop.

With reference now to FIG. 8, exemplary method 800 is illustrated. Method 800 can provide for additional elements or aspects in connection with point-to-point analysis to generate an improved SSP based on propagation path data in accordance with certain embodiments of this disclosure. For example, at reference numeral 802, the device can determine an obstruction distance or depth. The obstruction distance can be representative of an amount of the propagation path that is determined to be obstructed.

As noted at reference numeral 908, a signal strength predication can be determined. At reference numeral 804, the device can determine the signal strength prediction further based on the amount of the propagation path that is determined to be obstructed. In other words, such can be based on the obstruction distance determined at reference numeral 802.

At reference numeral 806, the device can determine an obstruction type that identifies a type of obstruction that obstructs the propagation path. For example, the device can potentially distinguish between foliage and terrain as well as certain characteristics (e.g., density, etc.) of the obstruction.

Example Operating Environments

Figure 9:
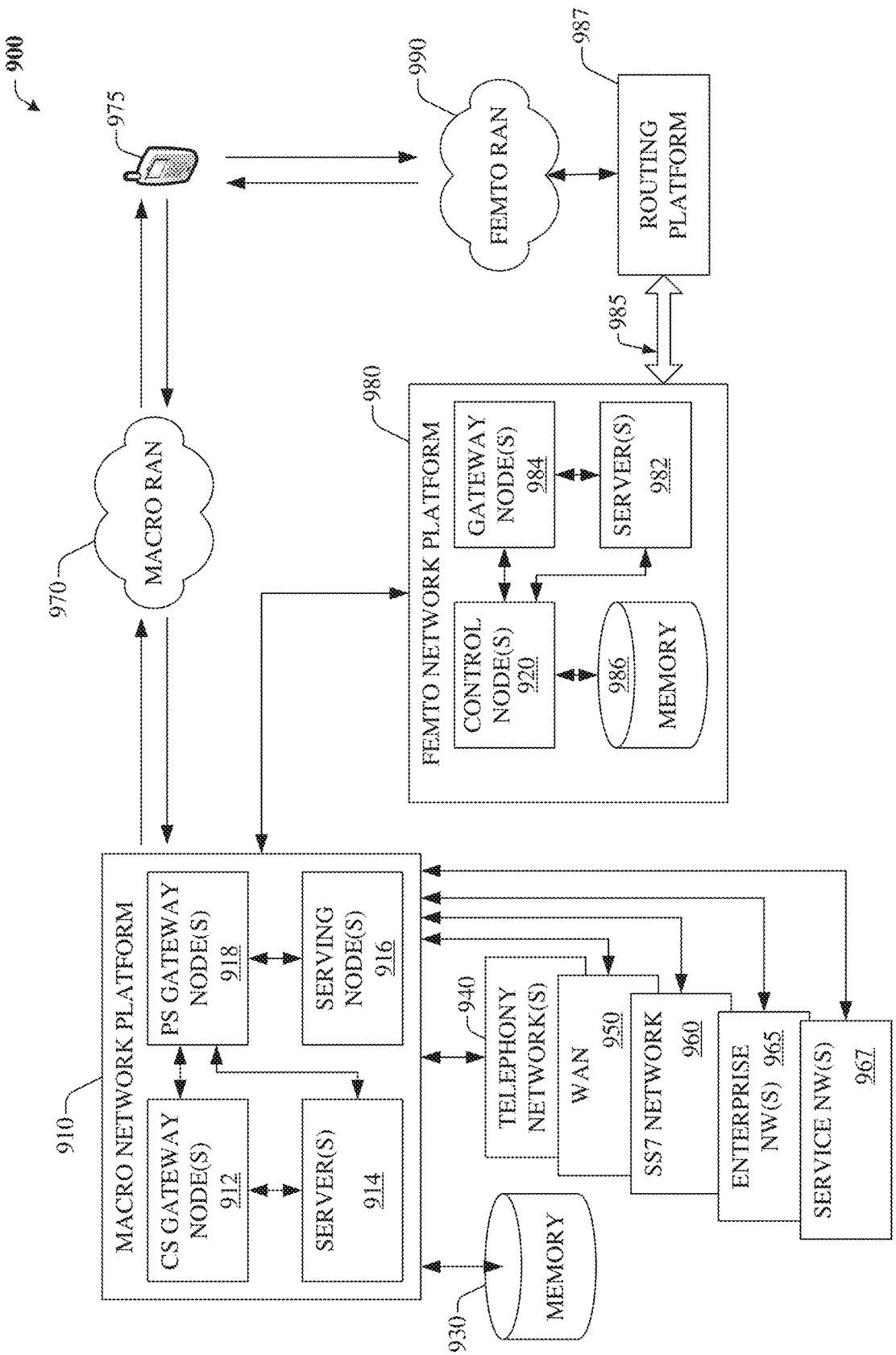
FIG. 9 illustrates a first example of a wireless communications environment with associated components that can be operable to execute certain embodiments of this disclosure.

To provide further context for various aspects of the subject specification, FIG. 9 illustrates an example wireless communication environment 900, with associated components that can enable operation of a femtocell enterprise network in accordance with aspects described herein. Wireless communication environment 900 comprises two wireless network platforms: (i) A macro network platform 910 that serves, or facilitates communication with, user equipment 975 via a macro radio access network (RAN) 970. It should be appreciated that in cellular wireless technologies (e.g., 4G, 3GPP UMTS, HSPA, 3GPP LTE, 3GPP UMB, 5G), macro network platform 910 is embodied in a Core Network. (ii) A femto network platform 980, which can provide communication with UE 975 through a femto RAN 990, linked to the femto network platform 980 through a routing platform 987 via backhaul pipe(s) 985. It should be appreciated that femto network platform 980 typically offloads UE 975 from macro network, once UE 975 attaches (e.g., through macro-to-femto handover, or via a scan of channel resources in idle mode) to femto RAN.

It is noted that RAN comprises base station(s), or access point(s), and its associated electronic circuitry and deployment site(s), in addition to a wireless radio link operated in accordance with the base station(s). Accordingly, macro RAN 1370 can comprise various coverage cells, while femto RAN 990 can comprise multiple femto access points or multiple metro cell access points. As mentioned above, it is to be appreciated that deployment density in femto RAN 990 can be substantially higher than in macro RAN 970.

Generally, both macro and femto network platforms 910 and 980 comprise components, e.g., nodes, gateways, interfaces, servers, or platforms, that facilitate both packet-switched (PS) (e.g., internet protocol (IP), Ethernet, frame relay, asynchronous transfer mode (ATM)) and circuit-switched (CS) traffic (e.g., voice and data) and control generation for networked wireless communication. In an aspect of the subject innovation, macro network platform 910 comprises CS gateway node(s) 912 which can interface CS traffic received from legacy networks like telephony network(s) 940 (e.g., public switched telephone network (PSTN), or public land mobile network (PLMN)) or a SS7 network 960. Circuit switched gateway 912 can authorize and authenticate traffic (e.g., voice) arising from such networks. Additionally, CS gateway 912 can access mobility, or roaming, data generated through SS7 network 960; for instance, mobility data stored in a VLR, which can reside in memory 930. Moreover, CS gateway node(s) 912 interfaces CS-based traffic and signaling and gateway node(s) 918. As an example, in a 3GPP UMTS network, gateway node(s) 918 can be embodied in gateway GPRS support node(s) (GGSN).

In addition to receiving and processing CS-switched traffic and signaling, gateway node(s) 918 can authorize and authenticate PS-based data sessions with served (e.g., through macro RAN) wireless devices. Data sessions can comprise traffic exchange with networks external to the macro network platform 910, like wide area network(s) (WANs) 950; it should be appreciated that local area network(s) (LANs) can also be interfaced with macro network platform 910 through gateway node(s) 918. Gateway node(s) 918 generates packet data contexts when a data session is established. To that end, in an aspect, gateway node(s) 918 can comprise a tunnel interface (e.g., tunnel termination gateway (TTG) in 3GPP UMTS network(s); not shown) which can facilitate packetized communication with disparate wireless network(s), such as Wi-Fi networks. It should be further appreciated that the packetized communication can comprise multiple flows that can be generated through server(s) 914. It is to be noted that in 3GPP UMTS network(s), gateway node(s) 1318 (e.g., GGSN) and tunnel interface (e.g., TTG) comprise a packet data gateway (PDG).

Macro network platform 910 also comprises serving node(s) 916 that convey the various packetized flows of information or data streams, received through gateway node(s) 918. As an example, in a 3GPP UMTS network, serving node(s) can be embodied in serving GPRS support node(s) (SGSN).

As indicated above, server(s) 914 in macro network platform 910 can execute numerous applications (e.g., location services, online gaming, wireless banking, wireless device management . . . ) that generate multiple disparate packetized data streams or flows, and manage (e.g., schedule, queue, format . . . ) such flows. Such application(s), for example can comprise add-on features to standard services provided by macro network platform 910. Data streams can be conveyed to gateway node(s) 918 for authorization/authentication and initiation of a data session, and to serving node(s) 916 for communication thereafter. Server(s) 914 can also effect security (e.g., implement one or more firewalls) of macro network platform 910 to ensure network's operation and data integrity in addition to authorization and authentication procedures that CS gateway node(s) 912 and gateway node(s) 918 can enact. Moreover, server(s) 914 can provision services from external network(s), e.g., WAN 950, or Global Positioning System (GPS) network(s) (not shown). It is to be noted that server(s) 914 can comprise one or more processor configured to confer at least in part the functionality of macro network platform 910. To that end, the one or more processors can execute code instructions stored in memory 930, for example.

In example wireless environment 900, memory 930 stores information related to operation of macro network platform 910. Information can comprise business data associated with subscribers; market plans and strategies, e.g., promotional campaigns, business partnerships; operational data for mobile devices served through macro network platform; service and privacy policies; end-user service logs for law enforcement; and so forth. Memory 930 can also store information from at least one of telephony network(s) 940, WAN(s) 950, or SS7 network 960, enterprise NW(s) 965, or service NW(s) 967.

Femto gateway node(s) 984 have substantially the same functionality as PS gateway node(s) 918. Additionally, femto gateway node(s) 984 can also comprise substantially all functionality of serving node(s) 916. In an aspect, femto gateway node(s) 984 facilitates handover resolution, e.g., assessment and execution. Further, control node(s) 920 can receive handover requests and relay them to a handover component (not shown) via gateway node(s) 984. According to an aspect, control node(s) 920 can support RNC capabilities.

Server(s) 982 have substantially the same functionality as described in connection with server(s) 914. In an aspect, server(s) 982 can execute multiple application(s) that provide service (e.g., voice and data) to wireless devices served through femto RAN 990. Server(s) 982 can also provide security features to femto network platform. In addition, server(s) 982 can manage (e.g., schedule, queue, format . . . ) substantially all packetized flows (e.g., IP-based) it generates in addition to data received from macro network platform 910. It is to be noted that server(s) 982 can comprise one or more processor configured to confer at least in part the functionality of macro network platform 910. To that end, the one or more processors can execute code instructions stored in memory 986, for example.

Memory 986 can comprise information relevant to operation of the various components of femto network platform 980. For example, operational information that can be stored in memory 986 can comprise, but is not limited to, subscriber information; contracted services; maintenance and service records; femto cell configuration (e.g., devices served through femto RAN 990; access control lists, or white lists); service policies and specifications; privacy policies; add-on features; and so forth.

It is noted that femto network platform 980 and macro network platform 910 can be functionally connected through one or more reference link(s) or reference interface(s). In addition, femto network platform 980 can be functionally coupled directly (not illustrated) to one or more of external network(s) 940, 950, 960, 965 or 967. Reference link(s) or interface(s) can functionally link at least one of gateway node(s) 984 or server(s) 986 to the one or more external networks 940, 950, 960, 965 or 967.

Figure 10:
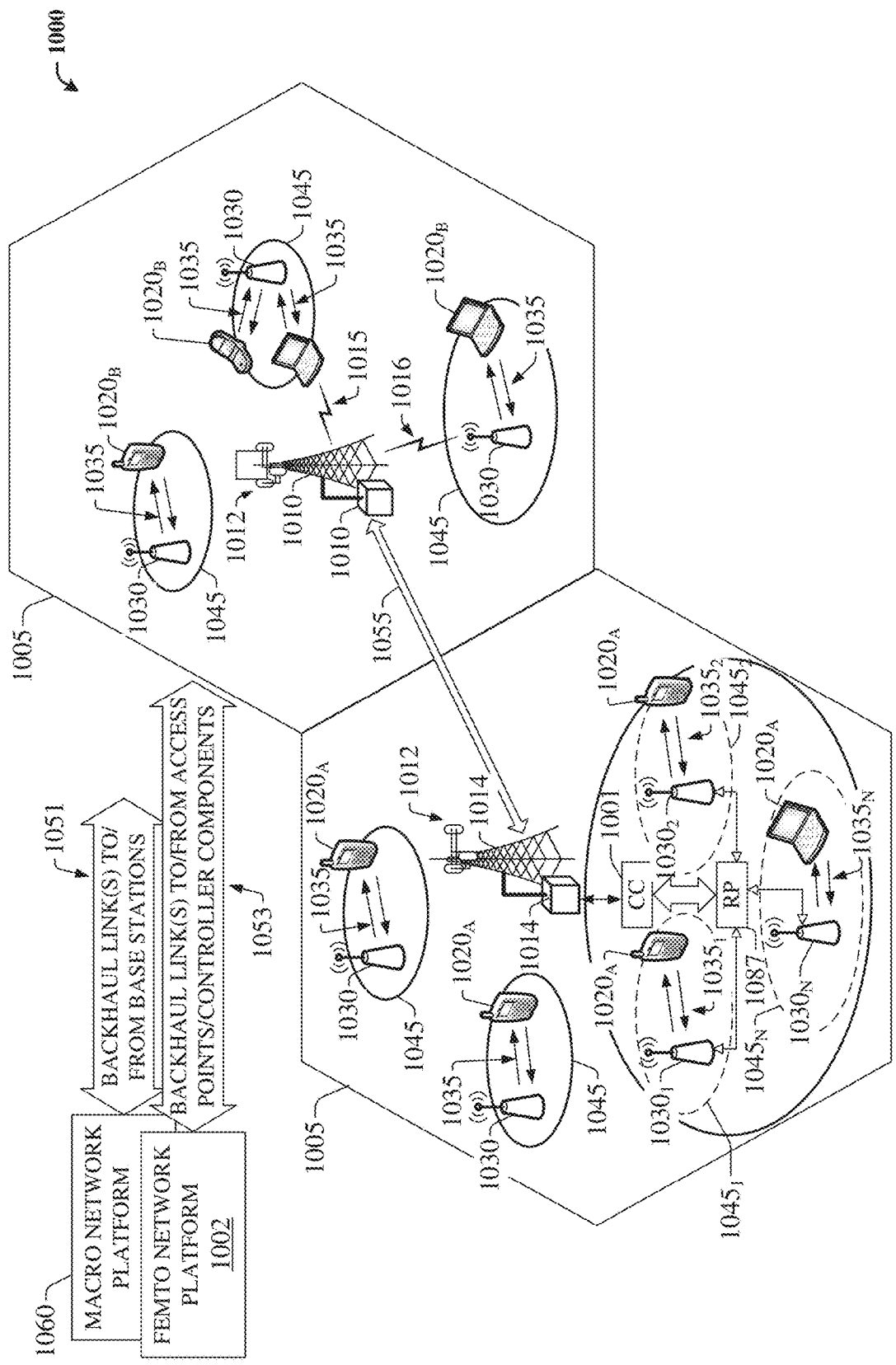
FIG. 10 illustrates a second example of a wireless communications environment with associated components that can be operable to execute certain embodiments of this disclosure.

FIG. 10 illustrates a wireless environment that comprises macro cells and femtocells for wireless coverage in accordance with aspects described herein. In wireless environment 1005, two areas represent "macro" cell coverage; each macro cell is served by a base station 1010. It can be appreciated that macro cell coverage area 1005 and base station 1010 can comprise functionality, as more fully described herein, for example, with regard to system 1000. Macro coverage is generally intended to serve mobile wireless devices, like UE $1020_A$, $1020_B$, in outdoors locations. An over-the-air (OTA) wireless link 1035 provides such coverage, the wireless link 1035 comprises a downlink (DL) and an uplink (UL), and utilizes a predetermined band, licensed or unlicensed, of the radio frequency (RF) spectrum. As an example, UE $1020_A$, $1020_B$ can be a 3GPP Universal Mobile Telecommunication System (UMTS) mobile phone. It is noted that a set of base stations, its associated electronics, circuitry or components, base stations control component(s), and wireless links operated in accordance with respective base stations in the set of base stations form a radio access network (RAN). In addition, base station 1010 communicates via backhaul link(s) 1051 with a macro network platform 1060, which in cellular wireless technologies (e.g., 3rd Generation Partnership Project (3GPP) Universal Mobile Telecommunication System (UMTS), Global System for Mobile Communication (GSM)) represents a core network.

In an aspect, macro network platform 1060 controls a set of base stations 1010 that serve either respective cells or a number of sectors within such cells. Base station 1010 comprises radio equipment 1014 for operation in one or more radio technologies, and a set of antennas 1012 (e.g., smart antennas, microwave antennas, satellite dish(es) . . . ) that can serve one or more sectors within a macro cell 1005. It is noted that a set of radio network control node(s), which can be a part of macro network platform 1060; a set of base stations (e.g., Node B 1010) that serve a set of macro cells 1005; electronics, circuitry or components associated with the base stations in the set of base stations; a set of respective OTA wireless links (e.g., links 1015 or 1016) operated in accordance to a radio technology through the base stations; and backhaul link(s) 1055 and 1051 form a macro radio access network (RAN). Macro network platform 1060 also communicates with other base stations (not shown) that serve other cells (not shown). Backhaul link(s) 1051 or 1053 can comprise a wired backbone link (e.g., optical fiber backbone, twisted-pair line, T1/E1 phone line, a digital subscriber line (DSL) either synchronous or asynchronous, an asymmetric ADSL, or a coaxial cable . . . ) or a wireless (e.g., line-of-sight (LOS) or non-LOS) backbone link. Backhaul pipe(s) 1055 link disparate base stations 1010. According to an aspect, backhaul link 1053 can connect multiple femto access points 1030 and/or controller components (CC) 1001 to the femto network platform 1002. In one example, multiple femto APs can be connected to a routing platform (RP) 1087, which in turn can be connect to a controller component (CC) 1001. Typically, the information from UEs $1020_A$ can be routed by the RP 1087, for example, internally, to another UE $1020_A$ connected to a disparate femto AP connected to the RP 1087, or, externally, to the femto network platform 1002 via the CC 1001, as discussed in detail supra.

In wireless environment 1005, within one or more macro cell(s) 1005, a set of femtocells 1045 served by respective femto access points (APs) 1030 can be deployed. It can be appreciated that, aspects of the subject innovation can be geared to femtocell deployments with substantive femto AP density, e.g., $10^4$-$10^7$ femto APs 1030 per base station 1010. According to an aspect, a set of femto access points $1030_1$-$1030_N$, with N a natural number, can be functionally connected to a routing platform 1087, which can be functionally coupled to a controller component 1001. The controller component 1001 can be operationally linked to the femto network platform 1002 by employing backhaul link(s) 1053. Accordingly, UE $1020_A$ connected to femto APs $1030_1$-$1030_N$ can communicate internally within the femto enterprise via the routing platform (RP) 1087 and/or can also communicate with the femto network platform 1002 via the RP 1087, controller component 1001 and the backhaul link(s) 1053. It can be appreciated that although only one femto enterprise is depicted in FIG. 10, multiple femto enterprise networks can be deployed within a macro cell 1005.

It is noted that while various aspects, features, or advantages described herein have been illustrated through femto access point(s) and associated femto coverage, such aspects and features also can be exploited for home access point(s) (HAPs) that provide wireless coverage through substantially any, or any, disparate telecommunication technologies, such as for example Wi-Fi (wireless fidelity) or picocell telecommunication. Additionally, aspects, features, or advantages of the subject innovation can be exploited in substantially any wireless telecommunication, or radio, technology; for example, Wi-Fi, Worldwide Interoperability for Microwave Access (WiMAX), Enhanced General Packet Radio Service (Enhanced GPRS), 3GPP LTE, 3GPP2 UMB, 3GPP UMTS, HSPA, HSDPA, HSUPA, or LTE Advanced. Moreover, substantially all aspects of the subject innovation can comprise legacy telecommunication technologies.

With respect to FIG. 10, in example embodiment 1000, base station AP 1010 can receive and transmit signal(s) (e.g., traffic and control signals) from and to wireless devices, access terminals, wireless ports and routers, etc., through a set of antennas $1012_1$-$1012_N$. It should be appreciated that while antennas $1012_1$-$1012_N$ are a part of communication platform 1025, which comprises electronic components and associated circuitry that provides for processing and manipulating of received signal(s) (e.g., a packet flow) and signal(s) (e.g., a broadcast control channel) to be transmitted. In an aspect, communication platform 1025 comprises a transmitter/receiver (e.g., a transceiver) 1066 that can convert signal(s) from analog format to digital format upon reception, and from digital format to analog format upon transmission. In addition, receiver/transmitter 1066 can divide a single data stream into multiple, parallel data streams, or perform the reciprocal operation. Coupled to transceiver 1066 is a multiplexer/demultiplexer 1067 that facilitates manipulation of signal in time and frequency space. Electronic component 1067 can multiplex information (data/traffic and control/signaling) according to various multiplexing schemes such as time division multiplexing (TDM), frequency division multiplexing (FDM), orthogonal frequency division multiplexing (OFDM), code division multiplexing (CDM), space division multiplexing (SDM). In addition, mux/demux component 1067 can scramble and spread information (e.g., codes) according to substantially any code known in the art; e.g., Hadamard-Walsh codes, Baker codes, Kasami codes, polyphase codes, and so on. A modulator/demodulator 1068 is also a part of operational group 1025, and can modulate information according to multiple modulation techniques, such as frequency modulation, amplitude modulation (e.g., M-ary quadrature amplitude modulation (QAM), with M a positive integer), phase-shift keying (PSK), and the like.

Figure 11:
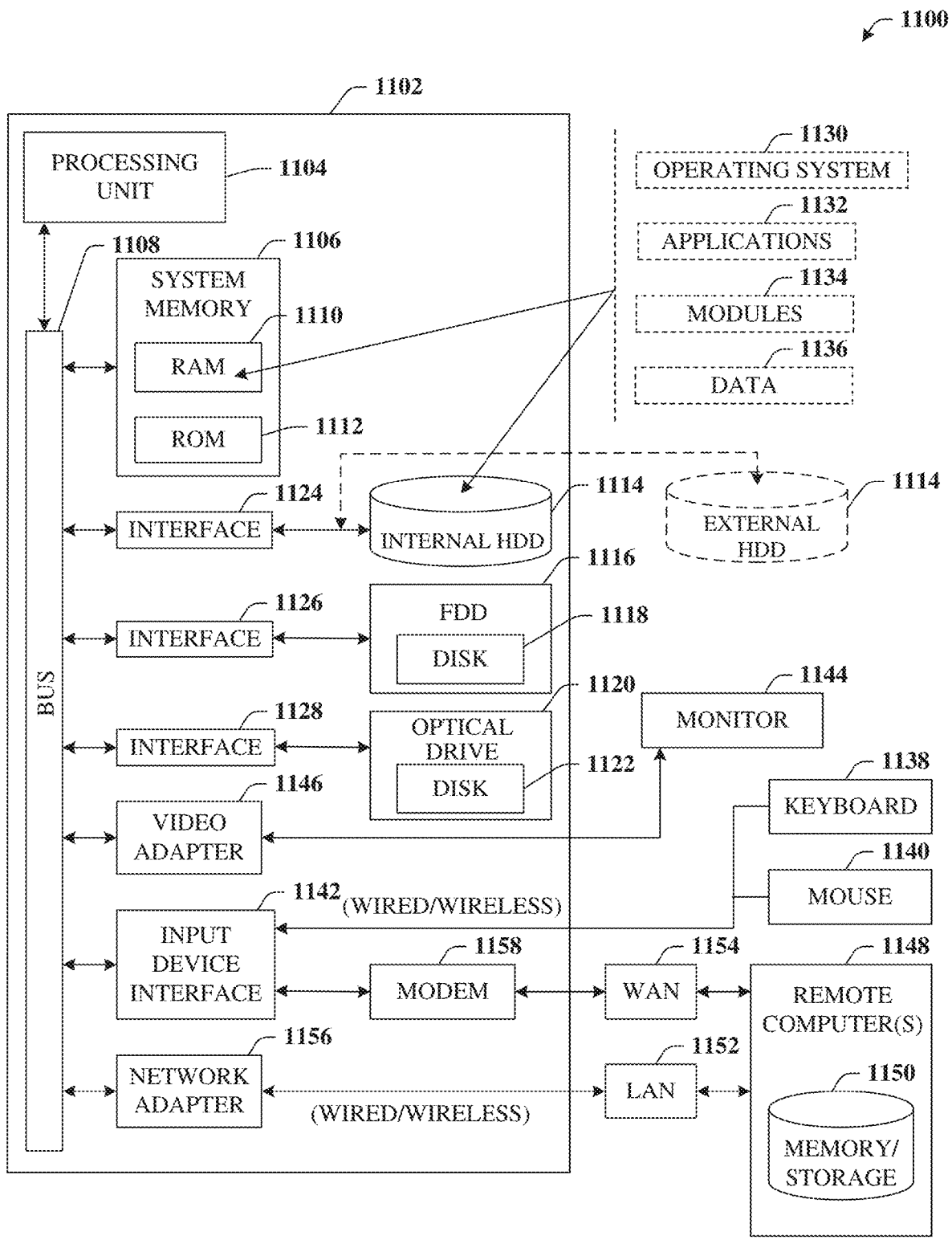
FIG. 11 illustrates an example block diagram of a computer operable to execute certain embodiments of this disclosure.

Referring now to FIG. 11, there is illustrated a block diagram of an exemplary computer system operable to execute the disclosed architecture. In order to provide additional context for various aspects of the disclosed subject matter, FIG. 11 and the following discussion are intended to provide a brief, general description of a suitable computing environment 1100 in which the various aspects of the disclosed subject matter can be implemented. Additionally, while the disclosed subject matter described above may be suitable for application in the general context of computer-executable instructions that may run on one or more computers, those skilled in the art will recognize that the disclosed subject matter also can be implemented in combination with other program modules and/or as a combination of hardware and software.

Generally, program modules comprise routines, programs, components, data structures, etc., that perform particular tasks or implement particular abstract data types. Moreover, those skilled in the art will appreciate that the various methods can be practiced with other computer system configurations, including single-processor or multi-processor computer systems, minicomputers, mainframe computers, as well as personal computers, hand-held computing devices, microprocessor-based or programmable consumer electronics, and the like, each of which can be operatively coupled to one or more associated devices.

The illustrated aspects of the disclosed subject matter may also be practiced in distributed computing environments where certain tasks are performed by remote processing devices that are linked through a communications network. In a distributed computing environment, program modules can be located in both local and remote memory storage devices.

A computer typically comprises a variety of computer readable media. Computer readable media can be any available media that can be accessed by the computer and comprises both volatile and nonvolatile media, removable and non-removable media. By way of example, and not limitation, computer-readable media can comprise computer storage media and communication media. Computer storage media can comprise either volatile or nonvolatile, removable and non-removable media implemented in any method or technology for storage of information such as computer-readable instructions, data structures, program modules or other data. Computer storage media comprises, but is not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and comprises any information delivery media. The term "modulated data signal" means a signal that has one or more of its characteristics set or changed in such a manner as to encode information in the signal. By way of example, and not limitation, communication media comprises wired media such as a wired network or direct-wired connection, and wireless media such as acoustic, RF, infrared and other wireless media. Combinations of the any of the above should also be included within the scope of computer-readable media.

Still referring to FIG. 11, the exemplary environment 1100 for implementing various aspects of the disclosed subject matter comprises a computer 1002, the computer 1102 including a processing unit 1104, a system memory 1106 and a system bus 1108. The system bus 1108 couples to system components including, but not limited to, the system memory 1106 to the processing unit 1104. The processing unit 1104 can be any of various commercially available processors. Dual microprocessors and other multi-processor architectures may also be employed as the processing unit 1104.

The system bus 1108 can be any of several types of bus structure that may further interconnect to a memory bus (with or without a memory controller), a peripheral bus, and a local bus using any of a variety of commercially available bus architectures. The system memory 1106 comprises read-only memory (ROM) 1110 and random access memory (RAM) 1112. A basic input/output system (BIOS) is stored in a non-volatile memory 1110 such as ROM, EPROM, EEPROM, which BIOS contains the basic routines that help to transfer information between elements within the computer 1102, such as during start-up. The RAM 1112 can also comprise a high-speed RAM such as static RAM for caching data.

The computer 1102 further comprises an internal hard disk drive (HDD) 1114 (e.g., EIDE, SATA), which internal hard disk drive 1114 may also be configured for external use in a suitable chassis (not shown), a magnetic floppy disk drive (FDD) 1116, (e.g., to read from or write to a removable diskette 1118) and an optical disk drive 1120, (e.g., reading a CD-ROM disk 1122 or, to read from or write to other high capacity optical media such as the DVD). The hard disk drive 1114, magnetic disk drive 1116 and optical disk drive 1120 can be connected to the system bus 1108 by a hard disk drive interface 1124, a magnetic disk drive interface 1126 and an optical drive interface 1128, respectively. The interface 1124 for external drive implementations comprises at least one or both of Universal Serial Bus (USB) and IEEE1394 interface technologies. Other external drive connection technologies are within contemplation of the subject matter disclosed herein.

The drives and their associated computer-readable media provide nonvolatile storage of data, data structures, computer-executable instructions, and so forth. For the computer 1102, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the disclosed subject matter.

A number of program modules can be stored in the drives and RAM 1112, including an operating system 1130, one or more application programs 1132, other program modules 1134 and program data 1136. All or portions of the operating system, applications, modules, and/or data can also be cached in the RAM 1112. It is appreciated that the disclosed subject matter can be implemented with various commercially available operating systems or combinations of operating systems.

A user can enter commands and information into the computer 1102 through one or more wired/wireless input devices, e.g., a keyboard 1138 and a pointing device, such as a mouse 1140. Other input devices (not shown) may comprise a microphone, an IR remote control, a joystick, a game pad, a stylus pen, touch screen, or the like. These and other input devices are often connected to the processing unit 1104 through an input device interface 1142 that is coupled to the system bus 1108, but can be connected by other interfaces, such as a parallel port, an IEEE1394 serial port, a game port, a USB port, an IR interface, etc.

A monitor 1144 or other type of display device is also connected to the system bus 1108 via an interface, such as a video adapter 1146. In addition to the monitor 1144, a computer typically comprises other peripheral output devices (not shown), such as speakers, printers, etc.

The computer 1102 may operate in a networked environment using logical connections via wired and/or wireless communications to one or more remote computers, such as a remote computer(s) 1148. The remote computer(s) 1148 can be a workstation, a server computer, a router, a personal computer, a mobile device, portable computer, microprocessor-based entertainment appliance, a peer device or other common network node, and typically comprises many or all of the elements described relative to the computer 1102, although, for purposes of brevity, only a memory/storage device 1150 is illustrated. The logical connections depicted comprise wired/wireless connectivity to a local area network (LAN) 1152 and/or larger networks, e.g., a wide area network (WAN) 1154. Such LAN and WAN networking environments are commonplace in offices and companies, and facilitate enterprise-wide computer networks, such as intranets, all of which may connect to a global communications network, e.g., the Internet.

When used in a LAN networking environment, the computer 1102 is connected to the local network 1152 through a wired and/or wireless communication network interface or adapter 1156. The adapter 1156 may facilitate wired or wireless communication to the LAN 1152, which may also comprise a wireless access point disposed thereon for communicating with the wireless adapter 1156.

When used in a WAN networking environment, the computer 1102 can comprise a modem 1158, or is connected to a communications server on the WAN 1154, or has other means for establishing communications over the WAN 1154, such as by way of the Internet. The modem 1158, which can be internal or external and a wired or wireless device, is connected to the system bus 1108 via the serial port interface 1142. In a networked environment, program modules depicted relative to the computer 1102, or portions thereof, can be stored in the remote memory/storage device 1150. It will be appreciated that the network connections shown are exemplary and other means of establishing a communications link between the computers can be used.

The computer 1102 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This comprises at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 2.4 and 5 GHz radio bands, at an 11 Mbps (802.11b) or 54 Mbps (802.11a) data rate, for example, or with products that contain both bands (dual band), so the networks can provide real-world performance similar to the basic "10BaseT" wired Ethernet networks used in many offices.

What has been described above comprises examples of the various embodiments. It is, of course, not possible to describe every conceivable combination of components or methodologies for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

As used in this application, the terms "system," "component," "interface," and the like are generally intended to refer to a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. These components also can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry that is operated by software or firmware application(s) executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. An interface can comprise input/output (I/O) components as well as associated processor, application, and/or API components.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from by a computing device.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor also can be implemented as a combination of computing processing units.

In the subject specification, terms such as "store," "data store," "data storage," "database," "repository," "queue", and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory. In addition, memory components or memory elements can be removable or stationary. Moreover, memory can be internal or external to a device or component, or removable or stationary. Memory can comprise various types of media that are readable by a computer, such as hard-disc drives, zip drives, magnetic cassettes, flash memory cards or other types of memory cards, cartridges, or the like.

By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments comprise a system as well as a computer-readable medium having computer-executable instructions for performing the acts and/or events of the various methods.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communications media comprise wired media, such as a wired network or direct-wired connection, and wireless media such as acoustic, RF, infrared and other wireless media Further, terms like "user equipment," "user device," "mobile device," "mobile," station," "access terminal," "terminal," "handset," and similar terminology, generally refer to a wireless device utilized by a subscriber or user of a wireless communication network or service to receive or convey data, control, voice, video, sound, gaming, or substantially any data-stream or signaling-stream. The foregoing terms are utilized interchangeably in the subject specification and related drawings. Likewise, the terms "access point," "node B," "base station," "evolved Node B," "cell," "cell site," and the like, can be utilized interchangeably in the subject application, and refer to a wireless network component or appliance that serves and receives data, control, voice, video, sound, gaming, or substantially any data-stream or signaling-stream from a set of subscriber stations. Data and signaling streams can be packetized or frame-based flows. It is noted that in the subject specification and drawings, context or explicit distinction provides differentiation with respect to access points or base stations that serve and receive data from a mobile device in an outdoor environment, and access points or base stations that operate in a confined, primarily indoor environment overlaid in an outdoor coverage area. Data and signaling streams can be packetized or frame-based flows.

Furthermore, the terms "user," "subscriber," "customer," "consumer," and the like are employed interchangeably throughout the subject specification, unless context warrants particular distinction(s) among the terms. It should be appreciated that such terms can refer to human entities, associated devices, or automated components supported through artificial intelligence (e.g., a capacity to make inference based on complex mathematical formalisms) which can provide simulated vision, sound recognition and so forth. In addition, the terms "wireless network" and "network" are used interchangeable in the subject application, when context wherein the term is utilized warrants distinction for clarity purposes such distinction is made explicit.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while a particular feature may have been disclosed with respect to only one of several implementations, such feature may be combined with one or more other features of the other implementations as may be desired and advantageous for any given or particular application. Furthermore, to the extent that the terms "includes" and "including" and variants thereof are used in either the detailed description or the claims, these terms are intended to be inclusive in a manner similar to the term "comprising."

What is claimed is:

1. A device, comprising:
   a processor; and
   a memory that stores executable instructions that, when executed by the processor, facilitate performance of operations, comprising:
      determining line of sight data representative of a propagation path of a signal between an access point device and a target premises;
      in response to a determination that an obstruction is situated in the propagation path and obstructing a line of sight, performing a classification procedure comprising classifying the obstruction as one of a group of types of obstructions comprising: an above-ground object type indicative of an above-ground object and a portion of land type indicative of a portion of land; and
      determining a first signal strength prediction for the target premises in response to the classification procedure classifying the obstruction as the above-ground object type and determining a second signal strength prediction for the target premises in response to the classification procedure classifying the obstruction as the portion of land type.

2. The device of claim 1, wherein the determination that the obstruction is situated in the propagation path is based on a result of examining image data of locations determined to be along the line of sight.

3. The device of claim 2, wherein the classification procedure classifies the obstruction as the above-ground object type based on the result of the examining of the image data.

4. The device of claim 1, wherein the determination that the obstruction is situated in the propagation path is based on a result of examining elevation data of locations determined to be along the line of sight.

5. The device of claim 4, wherein the classification procedure classifies the obstruction as the portion of land type based on the result of the examining of the elevation data.

6. The device of claim 1, wherein the operations further comprise:
   determining object blocking data representative of the above-ground object situated in the line of sight; or
   determining ground blocking data representative of the portion of land situated in the line of sight.

7. The device of claim 6, wherein the object blocking data or the ground blocking data comprise a depth parameter representative of a length of the line of sight that is obstructed by the obstruction, and wherein the determining of the first signal strength prediction and the determining of the second signal strength prediction is based on the depth parameter.

8. The device of claim 1, wherein the determination that the obstruction is situated in the propagation path is based on a result of examining locations determined to be along the line of sight and within a defined distance from the target premises.

9. The device of claim 8, wherein the defined distance is a configurable parameter that is individually configurable for the determination that the obstruction is situated in the propagation path.

10. The device of claim 1, wherein the operations further comprise, based on the first signal strength prediction or the second signal strength prediction, determining whether an installation of customer premises equipment at the target premises is threshold likely to provide a defined quality of service.

11. The device of claim 1, wherein the operations further comprise, based on the first signal strength prediction, the second signal strength prediction, and the line of sight data, determining a remedial solution that is determined to improve a signal strength prediction for the target premises according to a defined improvement criterion.

12. The device of claim 1, wherein the operations further comprise, based on the first signal strength prediction, the second signal strength prediction, and the line of sight data, determining a location within the target premises for installation of customer premises equipment.

13. A non-transitory machine-readable medium, comprising executable instructions that, when executed by a processor of a device, facilitate performance of operations, comprising:
   determining line of sight data representative of a line of sight between an access point device and a target site;
   determining that an obstruction exists that obstructs the line of sight;
   performing a classification procedure comprising classifying the obstruction as one of a group of obstructions comprising: an above-ground object and a portion of land; and
   determining a first signal strength prediction for the target site in response to the classification procedure classifying the obstruction as the above-ground object and determining a second signal strength prediction for the target site in response to the classification procedure classifying the obstruction as the portion of land.

14. The non-transitory machine-readable medium of claim 13, wherein the determining that the obstruction exists is in response to examining image data of locations determined to be along the line of sight.

15. The non-transitory machine-readable medium of claim 13, wherein the determining that the obstruction exists is in response to examining elevation data of locations determined to be along the line of sight.

16. The non-transitory machine-readable medium of claim 13, wherein the operations further comprise determining object blocking data representative of the above-ground object situated in the line of sight or determining ground blocking data representative of the portion of land situated in the line of sight.

17. A method, comprising:
   determining, by a device comprising a processor, line of sight data representative of a line of sight between an access point device and a target premises;
   in response to a determination that an obstruction exists that obstructs the line of sight, performing, by the device, a classification procedure comprising classifying the obstruction as an above-ground object or a portion of land;
   in response to the obstruction being classified as the above-ground object, determining, by the device, a first signal strength prediction for the target premises; and
   in response to the obstruction being classified as the portion of land, determining, by the device, a second signal strength prediction for the target premises that differs from the first signal strength prediction.

18. The method of claim 17, further comprising determining, by the device, an obstruction distance representative of an amount of the line of sight that is determined to be obstructed.

19. The method of claim 18, wherein the determining of the first signal strength prediction or the second signal strength prediction is a function of the obstruction distance.

20. The method of claim 17, further comprising determining, by the device, an obstruction type that identifies a type of the obstruction that obstructs the line of sight.

* * * * *